(12) United States Patent
Hidaka et al.

(10) Patent No.: US 6,653,697 B2
(45) Date of Patent: Nov. 25, 2003

(54) HIGH FREQUENCY SWITCH CIRCUIT AND COMMUNICATIONS TERMINAL USING THE SAME

(75) Inventors: Kenichi Hidaka, Takatsuki (JP); Tadayoshi Nakatsuka, Toyonaka (JP); Katsushi Tara, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/104,060

(22) Filed: Mar. 25, 2002

(65) Prior Publication Data

US 2002/0140040 A1 Oct. 3, 2002

(30) Foreign Application Priority Data

Mar. 27, 2001 (JP) .......................................... 2001-089448

(51) Int. Cl.[7] ............................................. H01L 31/062
(52) U.S. Cl. ....................................... 257/393; 257/275
(58) Field of Search ................................. 257/393, 275; 455/78, 426; 333/262, 103; 307/115; 327/437, 534

(56) References Cited

U.S. PATENT DOCUMENTS

| 5,272,457 A | * | 12/1993 | Heckaman et al. | ......... 333/262 |
| 5,554,892 A | * | 9/1996 | Norimatsu | .................. 307/115 |
| 5,731,607 A | * | 3/1998 | Kohama | ...................... 257/275 |
| 5,748,053 A | * | 5/1998 | Kameyama et al. | ......... 333/103 |
| 5,812,939 A | * | 9/1998 | Kohama | ....................... 455/78 |
| 5,883,541 A | * | 3/1999 | Tahara et al. | ................. 327/434 |
| 6,094,088 A | * | 7/2000 | Yano | ........................... 327/534 |
| 6,256,495 B1 | * | 7/2001 | Francisco et al. | ............ 455/426 |

FOREIGN PATENT DOCUMENTS

JP          09055682          2/1997

* cited by examiner

*Primary Examiner*—David Nelms
*Assistant Examiner*—Thinh T Nguyen
(74) *Attorney, Agent, or Firm*—Stevens, Davis, Miller & Mosher, LLP (57) ABSTRACT

The invention is directed to the provision of a two-input, four-output high frequency switch circuit that can prevent the occurrence of in-band ripples of insertion loss in an ON path. The high frequency switch circuit is constructed from six field effect transistors, and a signal is passed through a selected one of signal paths in the two-input, four-output high frequency signal switch having a total of six signal terminals, wherein four additional field effect transistors, each of which, when ON, provides a characteristic impedance matched to the characteristic impedance of an external circuit, are respectively connected between ground and the signal paths leading to the remaining four signal terminals to which the signal is not passed and which therefore become open ends. When the signal is not passed, the respective four field effect transistors are put in operation, thereby eliminating the effects of standing waves occurring on the respective paths leading to the four signal terminals acting as open ends.

7 Claims, 9 Drawing Sheets

| ON PORT | CTL1 | CTL2 | CTL3 | CTL4 | CTL5 | CTL6 | CTL7 | CTL8 | CTL9 | CTL10 |
|---|---|---|---|---|---|---|---|---|---|---|
| RF5-RF4 | L | L | L | H | L | H | H | H | L | H |
| RF5-RF6 | L | L | H | L | H | L | L | H | H | H |
| RF2-RF4 | L | L | H | L | H | L | H | H | L | H |
| RF2-RF6 | L | L | L | H | L | H | L | H | H | H |
| RF2-RF3 | L | H | L | L | L | L | H | H | H | L |
| RF2-RF1 | H | L | L | L | L | L | H | L | H | H |

| ON PORT | CTL1 | CTL2 | CTL3 | CTL4 | CTL5 | CTL6 | CTL7 | CTL8 |
|---|---|---|---|---|---|---|---|---|
| RF5-RF4 | L | L | L | H | L | H | H | H |
| RF5-RF6 | L | L | H | L | H | L | L | H |
| RF2-RF4 | L | L | H | L | H | L | H | H |
| RF2-RF6 | L | L | L | H | L | H | L | H |
| RF2-RF3 | L | H | L | L | L | L | H | H |
| RF2-RF1 | H | L | L | L | L | L | H | L |

FIG. 9

HIGH FREQUENCY SWITCH CIRCUIT AND COMMUNICATIONS TERMINAL USING THE SAME

BACKGROUND OF THE INVENTION

1. Field of the Invention

The present invention relates to a two-input, four-output high frequency switch circuit as a switch semiconductor integrated circuit formed on a semiconductor substrate. The invention also relates to a communications terminal, such as a portable telephone terminal, constructed using a high frequency switch circuit. The present invention is particularly suited to a two-input, four-output high frequency switch circuit of which low insertion loss and high isolation are required, and a communications terminal constructed using the same.

2. Description of the Related Art

Mobile communications business, including car telephones and portable telephone terminals, has been developing rapidly in recent years. Nowadays, a variety of mobile communications systems are in operation all over the world. In these mobile communications systems, many portable telephone terminals use semiconductor field-effect transistors in their signal processing sections.

For portable telephone terminals for which portability is particularly important, monolithic microwave ICs using GaAs field effect transistors have been vigorously developed as semiconductor integrated circuit devices that can simultaneously achieve smaller size, lower operating voltage, and lower power consumption. Among others, the development of high frequency switch circuits to be used in portable telephone terminals to switch high frequency signals has become a pressing need.

When using a field effect transistor as a switching device, the bias voltage to be applied to the gate terminal of the field effect transistor must be controlled. For example, the field effect transistor can be put in the ON state by applying to the gate terminal a gate bias sufficiently higher than the pinch off voltage and thereby putting the drain-source channel in a low impedance state in a controlled manner. Conversely, the field effect transistor can be put in the OFF state by applying to the gate terminal a gate bias sufficiently lower than the pinch off voltage and thereby putting the drain-source channel in a high impedance state in a controlled manner.

When using a GaAs field effect transistor alone as described above, there arises the problem that high isolation cannot be achieved, though the insertion loss is small. If high isolation is to be achieved with a field effect transistor alone, the gate width of the field effect transistor should be reduced. Reducing the gate width, however, results in increased ON resistance, and hence the problem of increased insertion loss. It is therefore difficult to achieve low insertion loss and high isolation at the same time.

In this way, when using a field effect transistor alone, it is difficult to achieve low insertion loss and high isolation at the same time. In view of this, a plurality of field effect transistors are used in combination to overcome this problem.

As an example of a switch circuit employing such a configuration, there is a single pole dual throw switch constructed using one series field effect transistor and one shunt field effect transistor in combination for each signal path. With this configuration, since a radio frequency signal leaking via a capacitive component of the series field effect transistor in the OFF state can be flown to ground through the shunt field effect transistor in the ON state, high isolation can be achieved.

On the other hand, in a digital portable telephone terminal using a time division multiple access communications scheme, a dual pole dual throw switch is used to switch between the attached antenna and an external antenna, i.e., a test antenna, and also switch between the transmitter and receiver sections built in the portable telephone terminal. A dual pole dual throw switch is a switch that has first and second input terminals and first and second output terminals, and that switches signals from the first and second input terminals to the first and second output terminals, respectively, or conversely to the second and first output terminals, respectively.

As an example of equipment using such a dual pole dual throw switch, a communications terminal will be described below.

Figure 5:
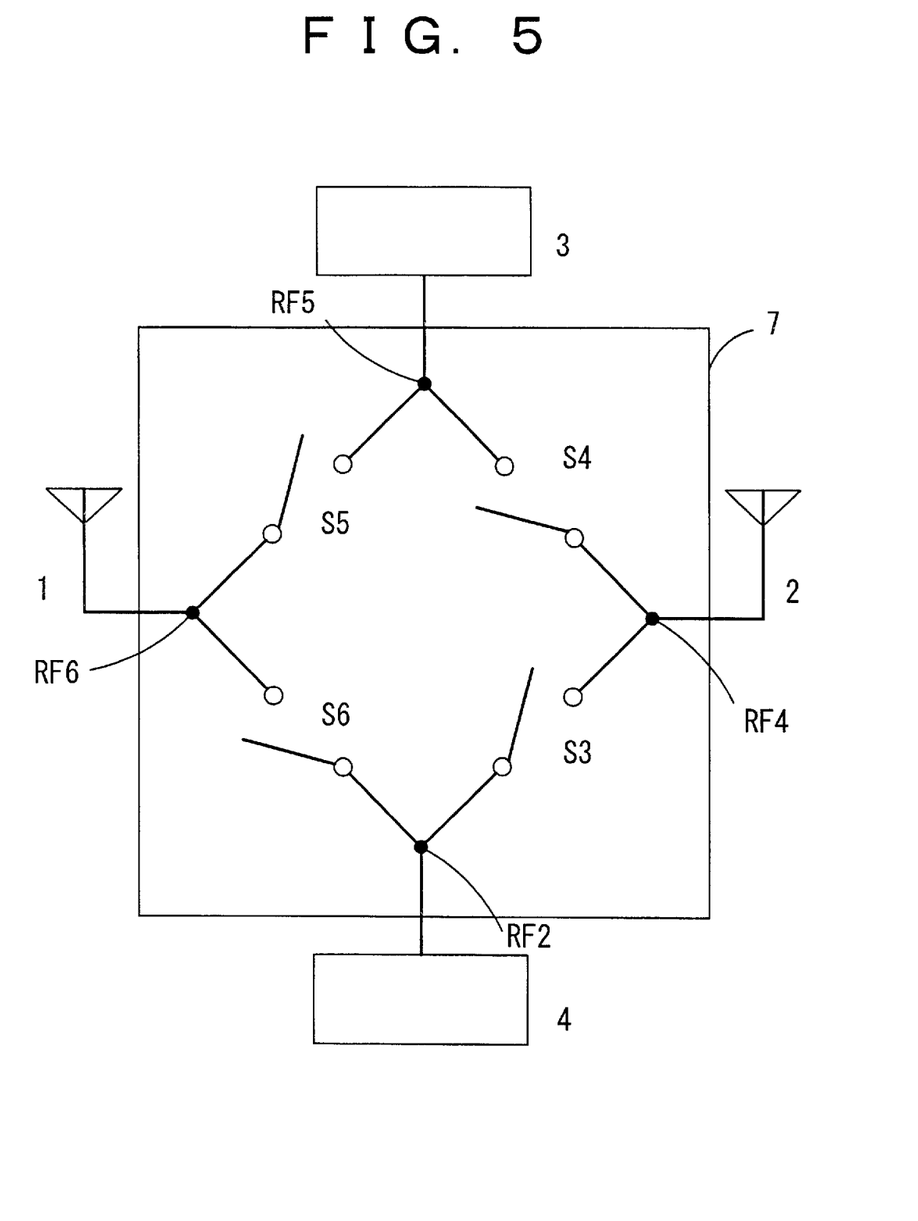
FIG. 5 is a circuit diagram showing the RF section of a communications terminal using a prior art dual pole dual throw switch.

FIG. 5 shows the RF section, i.e., the radio frequency signal processing section, of the communications terminal which uses the dual pole dual throw switch. This communications terminal is constructed to be able to switch connections between two antennas 1, 2 and transmitter and receiver sections 3, 4.

For this purpose, the dual pole dual throw switch 7 is provided with four signal terminals RF2, RF4, RF5, and RF6. A switch S3 is inserted, that is, connected in series, in a signal path connecting between the signal terminal RF2 and the signal terminal RF4. A switch S4 is inserted, that is, connected in series, in a signal path connecting between the signal terminal RF4 and the signal terminal RF5. A switch S5 is inserted, that is, connected in series, in a signal path connecting between the signal terminal RF5 and the signal terminal RF6. A switch S6 is inserted, that is, connected in series, in a signal path connecting between the signal terminal RF6 and the signal terminal RF2. The receiver section 4 is connected to the signal terminal RF2, and the transmitter section 3 is connected to the signal terminal RF5. The antenna 1 is connected to the signal terminal RF6, and the antenna 2 is connected to the signal terminal RF4.

Using the above configuration, signals to be input to the receiver section 4 can be input by switching between the two antennas 1 and 2. Likewise, output signals from the transmitter section 3 can be transmitted by switching between the two antennas 1 and 2.

However, today's portable telephone terminals use two antennas, i.e., a whip antenna as a transmitting/receiving antenna and a built-in antenna as a receiving antenna, for diversity reception. Further, to inspect such portable telephone terminals at the factory, two test antennas, one corresponding to the whip antenna and the other to the built-in antenna, are used.

To serve the purpose, the high frequency switch circuit is provided with four signal terminals as antenna terminals connected to the first, second, third, and fourth antennas, respectively. The first antenna is the whip antenna. The second antenna is the built-in antenna. The third antenna is the test antenna corresponding to the first antenna. The fourth antenna is the test antenna corresponding to the second antenna. The antenna terminals connected to the third and fourth antennas are called the test terminals, which are connected to the test antennas at the time of factory testing but are left open during normal use.

Therefore, the high frequency switch circuit has three switching functions, one for switching between transmission and reception, another for switching between the first and second antennas and the third and fourth antennas, and the other for switching between the receiving antennas for diversity reception, and is constructed so that any switch path can be connected within the high frequency switch circuit.

As an example of equipment using such a high frequency switch circuit, a communications terminal will be described below.

Figure 6:
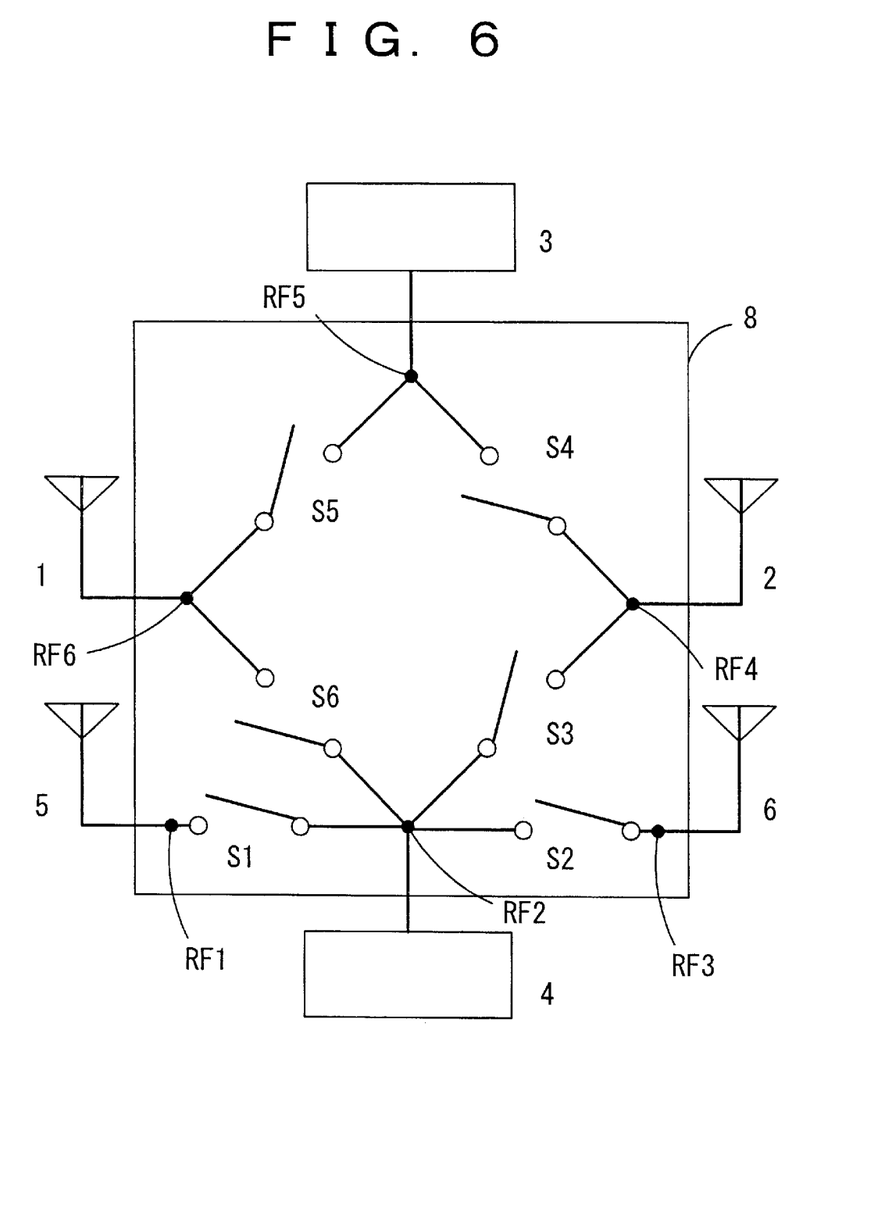
FIG. 6 is a circuit diagram showing the RF section of a communications terminal using a prior art two-input, four-output switch.

FIG. 6 shows the RF section, i.e., the radio frequency signal processing section, of the communications terminal which uses the high frequency switch circuit. This communications terminal uses a two-input, four-output switch 8 as the high frequency switch circuit, instead of the dual pole dual throw switch 7 shown in FIG. 5. The two-input, four-output switch 8 differs from the dual pole dual throw switch 7 shown in FIG. 5 by the addition of two signal terminals RF1 and RF3. A switch S1 is inserted, that is, connected in series, in a signal path connecting between the signal terminal RF2 and the signal terminal RF1. A switch S2 is inserted, that is, connected in series, in a signal path connecting between the signal terminal RF2 and the signal terminal RF3. An antenna 5 is connected to the signal terminal RF1, while an antenna 6 is connected to the signal terminal RF3.

Here, the antenna 1 is a whip antenna, the antenna 2 is a test antenna corresponding to the whip antenna, the antenna 5 is a built-in antenna, and the antenna 6 is a test antenna corresponding to the built-in antenna.

Though the name "two-input, four-output switch" is used throughout this specification, this is for convenience only, and it will be understood that there are cases in which the input/output relations, that is, signal propagation directions, are reversed from what the name suggests.

Figure 7:
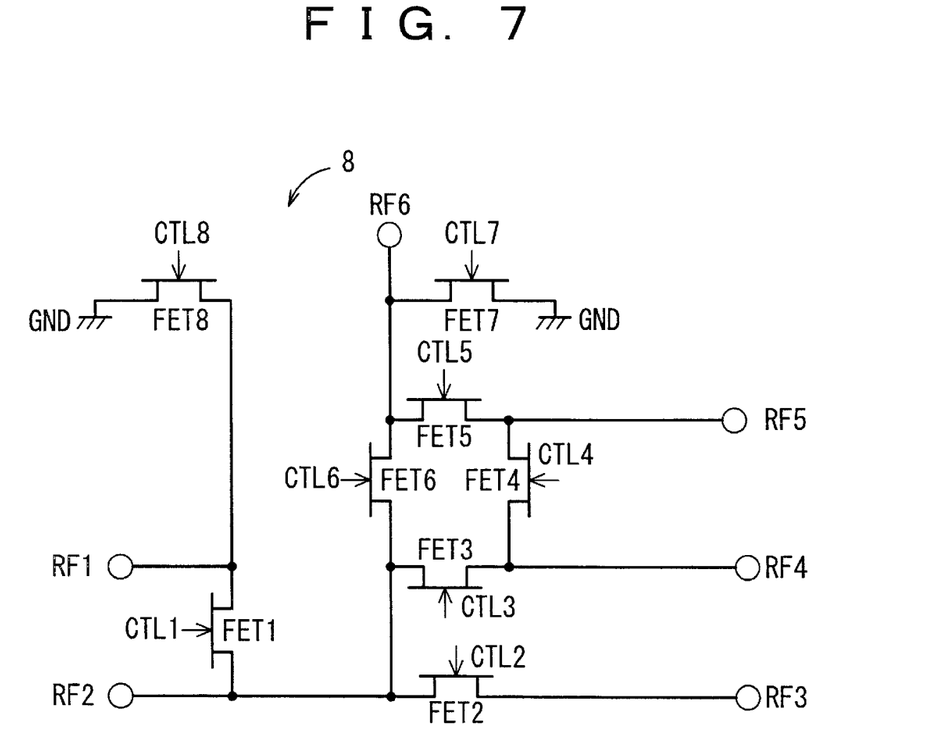
FIG. 7 is a circuit diagram showing the detailed configuration of the prior art two-input, four-output switch.

FIG. 7 is a circuit diagram showing the detailed configuration of the two-input, four-output switch 8 shown in FIG. 6. In FIG. 7, reference characters FET1 to FET6 indicate series field effect transistors forming the switches S1 to S6, respectively. Reference character FET7 designates a shunt field effect transistor for connecting the signal terminal RF6 to ground GND which is a reference potential. Reference character FET8 denotes a shunt field effect transistor for connecting the signal terminal RF1 to the ground GND, the reference potential. The ON/OFF operations of the field effect transistors FET1 to FET8 are controlled by control bias voltages CTL1 to CTL8, respectively. The remainder of the configuration is the same as that described with reference to FIG. 6.

In the prior art, the field effect transistors FET7 and FET8 simply act to connect the respective signal terminals RF6 and RF1 to the ground GND, the reference potential. In other words, neither of the field effect transistors FET7, FET8 has a characteristic impedance to be matched to an external circuit.

Figure 8:
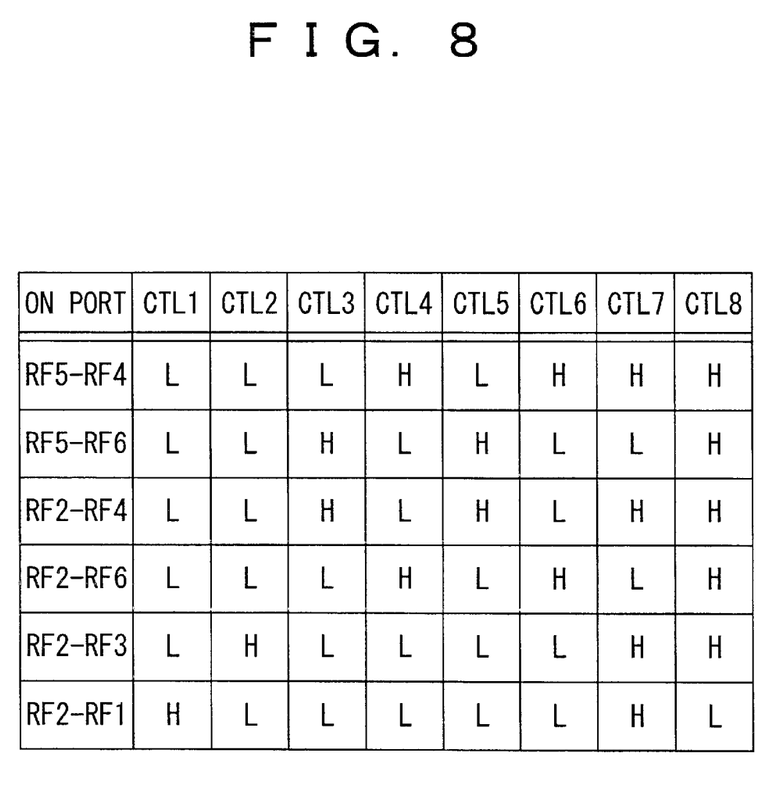
FIG. 8 is a truth table for explaining the operation of the two-input, four-output switch of FIG. 7.

Next, transmit and receive operations of the communications terminal shown in FIGS. 6 and 7 will be described. In the time division multiple access scheme, transmit and receive operations are not performed simultaneously. Therefore, in the time division multiple access scheme, the transmit and receive operations are performed in time division fashion in a controlled manner by switching the control bias voltages CTL1 to CTL8 between high and low. The operating states of the two-input, four-output switch 8 based on the control bias voltages CTL1 to CTL8 are shown in the form of a truth table in FIG. 8.

First, a description will be given of how the connection between the signal terminal RF1 and the signal terminal RF2 is turned on. In this case, the control bias voltages CTL1 to CTL8 are set to the voltage levels shown in the ON PORT "RF2-RF1" row in FIG. 8. As a result, the field effect transistors FET1 and FET7 are ON, and the field effect transistors FET2 to FET6 and FET8 are OFF. This puts the signal path between the signal terminal RF1 and the signal terminal RF2 in a low loss state, and the signal path between the signal terminal RF1 and the signal terminal RF2 is thus put in a state that can carry a radio frequency signal therethrough.

Next, a description will be given of how the connection between the signal terminal RF3 and the signal terminal RF2 is turned on. In this case, the control bias voltages CTL1 to CTL8 are set to the voltage levels shown in the ON PORT "RF2-RF3" row in FIG. 8. As a result, the field effect transistors FET2, FET7, and FET8 are ON, and the field effect transistors FET1 and FET3 to FET6 are OFF. This puts the signal path between the signal terminal RF3 and the signal terminal RF2 in a low loss state, and the signal path between the signal terminal RF3 and the signal terminal RF2 is thus put in a state that can carry a radio frequency signal therethrough.

Next, a description will be given of how the connection between the signal terminal RF6 and the signal terminal RF2 is turned on. In this case, the control bias voltages CTL1 to CTL8 are set to the voltage levels shown in the ON PORT "RF2-RF6" row in FIG. 8. As a result, the field effect transistors FET4, FET6, and FET8 are ON, and the field effect transistors FET1 to FET3, FET5, and FET7 are OFF. This puts the signal path between the signal terminal RF6 and the signal terminal RF2 in a low loss state, and the signal path between the signal terminal RF6 and the signal terminal RF2 is thus put in a state that can carry a radio frequency signal therethrough.

Next, a description will be given of how the connection between the signal terminal RF4 and the signal terminal RF2 is turned on. In this case, the control bias voltages CTL1 to CTL8 are set to the voltage levels shown in the ON PORT "RF2-RF4" row in FIG. 8. As a result, the field effect transistors FET3, FET5, FET7, and FET8 are ON, and the field effect transistors FET1, FET2, FET4, and FET6 are OFF. This puts the signal path between the signal terminal RF4 and the signal terminal RF2 in a low loss state, and the signal path between the signal terminal RF4 and the signal terminal RF2 is thus put in a state that can carry a radio frequency signal therethrough.

Next, a description will be given of how the connection between the signal terminal RF5 and the signal terminal RF6 is turned on. In this case, the control bias voltages CTL1 to CTL8 are set to the voltage levels shown in the ON PORT "RF5-RF6" row in FIG. 8. As a result, the field effect transistors FET3, FET5, and FET8 are ON, and the field effect transistors FET1, FET2, FET4, FET6, and FET7 are OFF. This puts the signal path between the signal terminal RF5 and the signal terminal RF6 in a low loss state, and the signal path between the signal terminal RF5 and the signal terminal RF6 is thus put in a state that can carry a radio frequency signal therethrough.

Next, a description will be given of how the connection between the signal terminal RF5 and the signal terminal RF4 is turned on. In this case, the control bias voltages CTL1 to CTL8 are set to the voltage levels shown in the ON PORT "RF5-RF4" row in FIG. 8. As a result, the field effect transistors FET4 and FET6 to FET8 are ON, and the field effect transistors FET1 to FET3 and FET5 are OFF. This puts the signal path between the signal terminal RF5 and the signal terminal RF4 in a low loss state, and the signal path between the signal terminal RF5 and the signal terminal RF4 is thus put in a state that can carry a radio frequency signal therethrough.

However, in the above prior art configuration, when switching is made to pass a signal through a particular path, paths at open ends are left unconnected with any paths. For example, in FIG. 7, when the path between the signal terminal RF1 and the signal terminal RF2 is turned on, the signal terminal RF3 and the signal terminal RF4 become open ends while on board the system, and standing waves are produced on the paths passing through the signal terminals RF3 and RF4.

The paths passing through the signal terminals RF3 and RF4, on which the standing waves are produced, are isolated from the signal path between the signal terminal RF1 and the signal terminal RF2 by turning off the field effect transistors FET2, FET3, etc. The field effect transistors FET2 and FET3 in the OFF state can be regarded as capacitors, and therefore, the signal path is regarded as being isolated by the capacitors from the paths on which the standing waves are produced. At this time, however, the capacitors for isolating them cannot completely eliminate the effects of the standing waves. The resulting problem is that insertion loss in the signal path abruptly increases at specific frequencies because of the effects of the standing waves, that is, the insertion loss is frequency dependent. In other words, the insertion loss exhibits in-band ripples.

Figure 9:
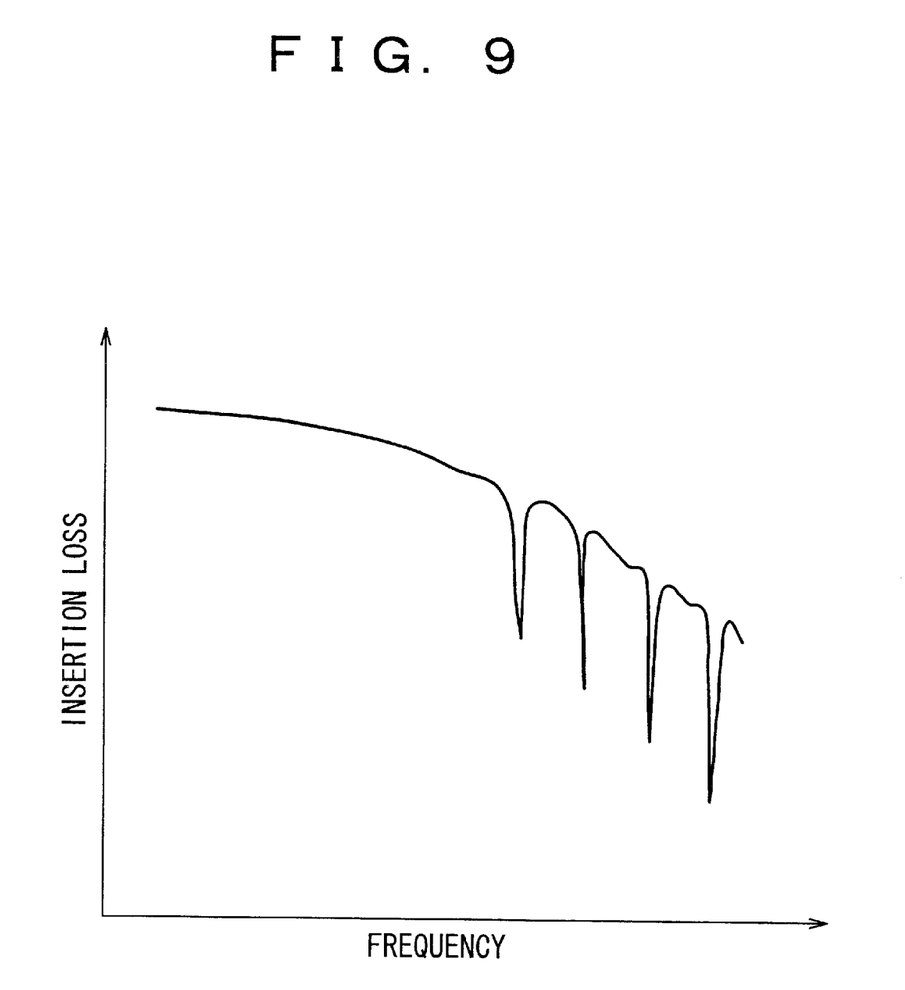
FIG. 9 is a characteristic diagram showing the insertion loss characteristic of the two-input, four-output switch shown in FIG. 7.

FIG. 9 shows the measured results of the insertion loss in the prior art configuration. The frequency is plotted along the abscissa and the insertion loss along the ordinate. As can be seen from FIG. 9, the insertion loss abruptly increases at certain frequencies.

A configuration in which a shunt field effect transistor is connected to a dual pole dual throw switch is disclosed, for example, in Japanese Unexamined Patent Publication No. 9-55682. In a dual pole dual throw switch, there are no terminals left open. However, in a two-input, four-output switch, the four terminals which are not used for the signal path can become open ended.

An open ended terminal on a semiconductor substrate is connected to leads by bonding wire, and the semiconductor substrate, the bonding wire, and the leads constitute a semiconductor device. The leads are connected to wiring lines and other devices on the printed circuit board. With such elements connected to the open ended terminal, a resonant circuit is formed. The effect of this resonance manifests itself in the form of a standing wave at the open ended terminal, and this affects the signal coupled to the open ended terminal via a field effect transistor FET.

This is a significant difference between the dual pole dual throw switch and the two-input, four-output switch of the present invention.

SUMMARY OF THE INVENTION

An object of the present invention is to provide a high frequency switch circuit that can alleviate the problem of the frequency dependence of insertion loss, and also provide a communications terminal using the same.

To achieve the above object, the high frequency switch circuit of the present invention, which is used as a high frequency switch circuit in a portable telephone terminal, includes a switch for matching an open ended path to an external impedance. The communications terminal is constructed using this high frequency switch circuit. The high frequency switch circuit here refers to a two-input, four-output switch.

More specifically, a high frequency switch circuit according to a first invention comprises: first, second, third, fourth, fifth, and sixth signal terminals; a first switch inserted in a first signal path connecting between the first signal terminal and the second signal terminal; a second switch inserted in a second signal path connecting between the second signal terminal and the third signal terminal; a third switch inserted in a third signal path connecting between the second signal terminal and the fourth signal terminal; a fourth switch inserted in a fourth signal path connecting between the fourth signal terminal and the fifth signal terminal; a fifth switch inserted in a fifth signal path connecting between the fifth signal terminal and the sixth signal terminal; a sixth switch inserted in a sixth signal path connecting between the second signal terminal and the sixth signal terminal; a seventh switch for selecting whether the sixth signal terminal is to be connected to a reference potential or be left open; an eighth switch for selecting whether the first signal terminal is to be connected to the reference potential (GND) or be left open; a ninth switch for selecting whether the fourth signal terminal is to be connected to the reference potential (GND) or be left open; and a tenth switch for selecting whether the third signal terminal is to be connected to the reference potential (GND) or be left open.

In the above configuration, each of the seventh, eighth, ninth, and tenth switches, when ON, exhibits a characteristic impedance that satisfies a matching condition to the characteristic impedance of an associated one of first, second, third, and fourth external circuits connected to the sixth, first, fourth, and third signal terminals, respectively.

In the high frequency switch circuit of the first invention described above, the seventh, eighth, ninth, and tenth switches are provided to select whether the sixth, first, fourth, and third signal terminals, respectively, are to be connected to the reference potential or be left open, and each of the seventh, eighth, ninth, and tenth switches is designed so as to exhibit, when ON, a characteristic impedance that satisfies the matching condition to the characteristic impedance of an associated one of the first, second, third, and fourth external circuits connected to the sixth, first, fourth, and third signal terminals, respectively. According to this configuration, when the sixth, first, fourth, and third signal terminals, respectively, are not used for a signal path, the seventh, eighth, ninth, and tenth switches, respectively, are caused to conduct, thereby suppressing the effects of standing waves on the signal path and thus alleviating the problem of the frequency dependence of insertion loss.

A high frequency switch circuit according to a second invention comprises: first, second, third, fourth, fifth, and sixth signal terminals; a first field effect transistor circuit inserted in a first signal path connecting between the first signal terminal and the second signal terminal; a second field effect transistor circuit inserted in a second signal path connecting between the second signal terminal and the third signal terminal; a third field effect transistor circuit inserted in a third signal path connecting between the second signal terminal and the fourth signal terminal; a fourth field effect transistor circuit inserted in a fourth signal path connecting between the fourth signal terminal and the fifth signal terminal; a fifth field effect transistor circuit inserted in a fifth signal path connecting between the fifth signal terminal and the sixth signal terminal; a sixth field effect transistor circuit inserted in a sixth signal path connecting between the second signal terminal and the sixth signal terminal; a seventh field effect transistor circuit connected between the sixth signal terminal and a reference potential; an eighth field effect transistor circuit connected between the first signal terminal and the reference potential; a ninth field effect transistor circuit connected between the fourth signal terminal and the reference potential; a tenth field effect transistor circuit connected between the third signal terminal and the reference potential; and first to tenth control lines for applying first to tenth control bias voltages to the control terminals of the first to tenth field effect transistor circuits.

In the above configuration, each of the seventh, eighth, ninth, and tenth field effect transistor circuits, when ON, exhibits a characteristic impedance that satisfies a matching condition to the characteristic impedance of an associated one of first, second, third, and fourth external circuits connected to the sixth, first, fourth, and third signal terminals, respectively.

In the high frequency switch circuit of the second invention described above, the seventh, eighth, ninth, and tenth field effect transistor circuits are provided between the reference potential and the sixth, first, fourth, and third signal terminals, respectively, and each of the seventh, eighth, ninth, and tenth field effect transistor circuits is designed so as to exhibit, when ON, a characteristic impedance that satisfies the matching condition to the characteristic impedance of an associated one of the first, second, third, and fourth external circuits connected to the sixth, first, fourth, and third signal terminals, respectively. According to this configuration, when the sixth, first, fourth, and third signal terminals, respectively, are not used for a signal path, the seventh, eighth, ninth, and tenth field effect transistor circuits, respectively, are operated and caused to conduct, thereby suppressing the effects of standing waves on the signal path and thus alleviating the problem of the frequency dependence of insertion loss.

A high frequency switch circuit according to a third invention comprises: first, second, third, fourth, fifth, and sixth signal terminals; a first field effect transistor circuit inserted in a first signal path connecting between the first signal terminal and the second signal terminal; a second field effect transistor circuit inserted in a second signal path connecting between the second signal terminal and the third signal terminal; a third field effect transistor circuit inserted in a third signal path connecting between the second signal terminal and the fourth signal terminal; a fourth field effect transistor circuit inserted in a fourth signal path connecting between the fourth signal terminal and the fifth signal terminal; a fifth field effect transistor circuit inserted in a fifth signal path connecting between the fifth signal terminal and the sixth signal terminal; a sixth field effect transistor circuit inserted in a sixth signal path connecting between the second signal terminal and the sixth signal terminal; a series circuit consisting of a seventh field effect transistor circuit and a first resistor, and connected between the sixth signal terminal and a reference potential; a series circuit consisting of an eighth field effect transistor circuit and a second resistor, and connected between the first signal terminal and the reference potential; a series circuit consisting of a ninth field effect transistor circuit and a third resistor, and connected between the fourth signal terminal and the reference potential; a series circuit consisting of a tenth field effect transistor circuit and a fourth resistor, and connected between the third signal terminal and the reference potential; and first to tenth control lines for applying first to tenth control bias voltages to the control terminals of the first to tenth field effect transistor circuits.

In the above configuration, sum of an ON-state characteristic impedance of the seventh field effect transistor circuit and a resistance value of the first resistor satisfies a matching condition to the characteristic impedance of a first external circuit connected to the sixth signal terminal. At the same time, sum of an ON-state characteristic impedance of the eighth field effect transistor circuit and a resistance value of the second resistor satisfies a matching condition to the characteristic impedance of a second external circuit connected to the first signal terminal. At the same time, sum of an ON-state characteristic impedance of the ninth field effect transistor circuit and a resistance value of the third resistor satisfies a matching condition to the characteristic impedance of a third external circuit connected to the fourth signal terminal. And at the same time, sum of an ON-state characteristic impedance of the tenth field effect transistor circuit and a resistance value of the fourth resistor satisfies a matching condition to the characteristic impedance of a fourth external circuit connected to the third signal terminal.

In the high frequency switch circuit of the third invention described above, the series circuits formed by connecting the seventh, eighth, ninth, and tenth field effect transistors in series with the first, second, third, and fourth resistors, respectively, are provided between the reference potential and the sixth, first, fourth, and third signal terminals, respectively, and the characteristic impedances of the respective series circuits when the respective seventh, eighth, ninth, and tenth field effect transistors are ON are set so as to satisfy the matching conditions to the characteristic impedances of the first, second, third, and fourth external circuits connected to the sixth, first, fourth, and third signal terminals, respectively. According to this configuration, when the sixth, first, fourth, and third signal terminals, respectively, are not used for a signal path, the seventh, eighth, ninth, and tenth field effect transistor circuits, respectively, are operated and caused to conduct. This alleviates the problem of the frequency dependence of insertion loss. Furthermore, since the impedance is provided using a resistor, the ON-state impedance of each field effect transistor can be reduced. As a result, the seventh, eighth, ninth, and tenth field effect transistors can be reduced in size by forming their associated resistors on the same semiconductor substrate, and hence, the chip size can be reduced.

A communications terminal according to a fourth invention comprises: a high frequency switch circuit having first, second, third, fourth, fifth, and sixth signal terminals; first, second, third, and fourth antennas electrically connected to the first, third, fourth, and sixth signal terminals, respectively; a receiver section which is connected to the second signal terminal, and to which high frequency signals received at the first, second, third, and fourth antennas are input; and a transmitter section which is connected to the fifth signal terminal, and which outputs high frequency signals to the third and fourth antennas.

The above high frequency switch circuit comprises: a first switch inserted in a first signal path connecting between the first signal terminal and the second signal terminal; a second switch inserted in a second signal path connecting between the second signal terminal and the third signal terminal; a third switch inserted in a third signal path connecting between the second signal terminal and the fourth signal terminal; a fourth switch inserted in a fourth signal path connecting between the fourth signal terminal and the fifth signal terminal; a fifth switch inserted in a fifth signal path connecting between the fifth signal terminal and the sixth signal terminal; a sixth switch inserted in a sixth signal path connecting between the second signal terminal and the sixth signal terminal; a seventh switch for selecting whether the sixth signal terminal is to be connected to a reference potential or be left open; an eighth switch for selecting whether the first signal terminal is to be connected to the reference potential (GND) or be left open; a ninth switch for selecting whether the fourth signal terminal is to be connected to the reference potential (GND) or be left open; and a tenth switch for selecting whether the third signal terminal is to be connected to the reference potential (GND) or be left open.

In the above configuration, each of the seventh, eighth, ninth, and tenth switches, when ON, exhibits a characteristic impedance that satisfies a matching condition to the characteristic impedance of an associated one of first, second, third, and fourth external circuits connected to the sixth, first, fourth, and third signal terminals, respectively.

According to this configuration, the same advantageous effect as that achieved by the high frequency switch circuit of the first invention can be obtained.

A communications terminal according to a fifth invention comprises: a high frequency switch circuit having first, second, third, fourth, fifth, and sixth signal terminals; first, second, third, and fourth antennas electrically connected to the first, third, fourth, and sixth signal terminals, respectively; a receiver section which is connected to the second signal terminal, and to which high frequency signals received at the first, second, third, and fourth antennas are input; and a transmitter section which is connected to the fifth signal terminal, and which outputs high frequency signals to the third and fourth antennas.

The above high frequency switch circuit comprises: a first field effect transistor circuit inserted in a first signal path connecting between the first signal terminal and the second signal terminal; a second field effect transistor circuit inserted in a second signal path connecting between the second signal terminal and the third signal terminal; a third field effect transistor circuit inserted in a third signal path connecting between the second signal terminal and the fourth signal terminal; a fourth field effect transistor circuit inserted in a fourth signal path connecting between the fourth signal terminal and the fifth signal terminal; a fifth field effect transistor circuit inserted in a fifth signal path connecting between the fifth signal terminal and the sixth signal terminal; a sixth field effect transistor circuit inserted in a sixth signal path connecting between the second signal terminal and the sixth signal terminal; a seventh field effect transistor circuit connected between the sixth signal terminal and a reference potential; an eighth field effect transistor circuit connected between the first signal terminal and the reference potential; a ninth field effect transistor circuit connected between the fourth signal terminal and the reference potential; a tenth field effect transistor circuit connected between the third signal terminal and the reference potential; and first to tenth control lines for applying first to tenth control bias voltages to the control terminals of the first to tenth field effect transistor circuits.

In the above configuration, each of the seventh, eighth, ninth, and tenth field effect transistor circuits, when ON, exhibits a characteristic impedance that satisfies a matching condition to the characteristic impedance of an associated one of first, second, third, and fourth external circuits connected to the sixth, first, fourth, and third signal terminals, respectively.

According to this configuration, the same advantageous effect as that achieved by the high frequency switch circuit of the second invention can be obtained.

A communications terminal according to a sixth invention comprises: a high frequency switch circuit having first, second, third, fourth, fifth, and sixth signal terminals; first, second, third, and fourth antennas electrically connected to the first, third, fourth, and sixth signal terminals, respectively; a receiver section which is connected to the second signal terminal, and to which high frequency signals received at the first, second, third, and fourth antennas are input; and a transmitter section which is connected to the fifth signal terminal, and which outputs high frequency signals to the third and fourth antennas.

The above high frequency switch circuit comprises: a first field effect transistor circuit inserted in a first signal path connecting between the first signal terminal and the second signal terminal; a second field effect transistor circuit inserted in a second signal path connecting between the second signal terminal and the third signal terminal; a third field effect transistor circuit inserted in a third signal path connecting between the second signal terminal and the fourth signal terminal; a fourth field effect transistor circuit inserted in a fourth signal path connecting between the fourth signal terminal and the fifth signal terminal; a fifth field effect transistor circuit inserted in a fifth signal path connecting between the fifth signal terminal and the sixth signal terminal; a sixth field effect transistor circuit inserted in a sixth signal path connecting between the second signal terminal and the sixth signal terminal; a series circuit consisting of a seventh field effect transistor circuit and a first resistor, and connected between the sixth signal terminal and a reference potential; a series circuit consisting of an eighth field effect transistor circuit and a second resistor, and connected between the first signal terminal and the reference potential; a series circuit consisting of a ninth field effect transistor circuit and a third resistor, and connected between the fourth signal terminal and the reference potential; a series circuit consisting of a tenth field effect transistor circuit and a fourth resistor, and connected between the third signal terminal and the reference potential; and first to tenth control lines for applying first to tenth control bias voltages to the control terminals of the first to tenth field effect transistor circuits.

In the above configuration, sum of an ON-state characteristic impedance of the seventh field effect transistor circuit and a resistance value of the first resistor satisfies a matching condition to the characteristic impedance of a first external circuit connected to the sixth signal terminal. At the same time, sum of an ON-state characteristic impedance of the eighth field effect transistor circuit and a resistance value of the second resistor satisfies a matching condition to the characteristic impedance of a second external circuit connected to the first signal terminal. At the same time, sum of an ON-state characteristic impedance of the ninth field effect transistor circuit and a resistance value of the third resistor satisfies a matching condition to the characteristic impedance of a third external circuit connected to the fourth signal terminal. And at the same time, sum of an ON-state characteristic impedance of the tenth field effect transistor circuit and a resistance value of the fourth resistor satisfies a matching condition to the characteristic impedance of a fourth external circuit connected to the third signal terminal.

According to this configuration, the same advantageous effect as that achieved by the high frequency switch circuit of the third invention can be obtained.

The high frequency switch circuits of the second and third inventions and the communications terminals of the fifth and sixth inventions may further include a logic circuit for generating the control bias voltages to be applied to the first to tenth field effect transistor circuits. In that case, the number of control signal lines can be reduced compared with the case where the control bias voltages are directly applied to the first to tenth field effect transistor circuits.

In the high frequency switch circuits of the second and third inventions and the communications terminals of the fifth and sixth inventions, the first to tenth field effect transistor circuits may each be constructed from a single field effect transistor, or may each be constructed from a series circuit of a plurality of field effect transistors.

In the high frequency switch circuits of the second and third inventions and the communications terminals of the fifth and sixth inventions, the field effect transistors forming the field effect transistor circuits may be single-gate field effect transistors, or may be multi-gate field effect transistors.

Preferably, in the high frequency switch circuit of the third invention and the communications terminal of the sixth invention, the first to tenth field effect transistor circuits and the first to fourth resistors are formed on a semiconductor circuit.

As described above, according to the high frequency switch circuit of the present invention and the communications terminal using the same, since the high frequency switch circuit includes switches each of which is used to select whether its associated signal terminal, when unconnected to a signal path, is to be connected to the reference potential or be left open, and each of which, when ON, provides a characteristic impedance matched to the characteristic impedance of its associated external circuit, the in-band ripple of insertion loss can be prevented and the frequency dependence of insertion loss eliminated.

Furthermore, according to the high frequency switch circuit of the present invention and the communications terminal using the same, since a field effect transistor having an ON-state characteristic impedance matched to the characteristic impedance of its associated external circuit, or a series circuit consisting of a field effect transistor and a resistor, is connected between the reference potential and a signal terminal that can become an open end, the in-band ripple of insertion loss can be prevented and the frequency dependence of insertion loss eliminated. Especially, when the series circuit consisting of a field effect transistor and a resistor is connected, since the impedance for matching can be divided between the field effect transistor and the resistor, the size of the field effect transistor can be reduced, and hence, the chip size can be reduced.

DESCRIPTION OF THE PREFERRED EMBODIMENTS

The preferred embodiments of the present invention will be described below with reference to drawings.

Embodiment 1

Figure 1:
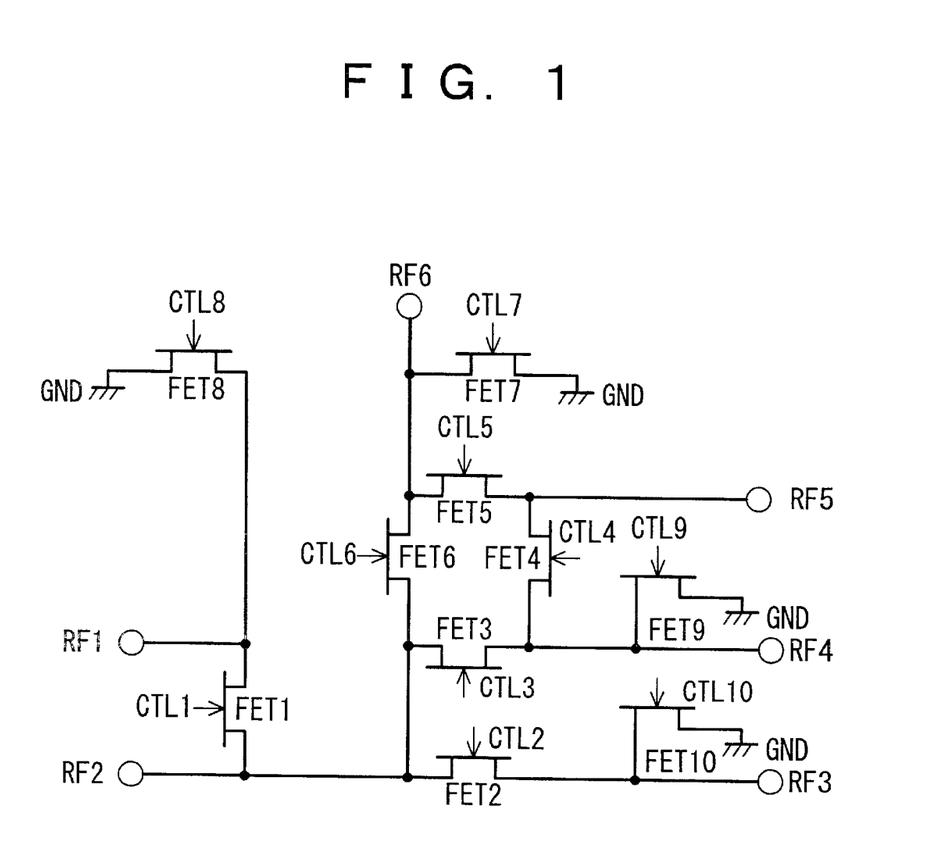
FIG. 1 is a circuit diagram showing the detailed configuration of a two-input, four-output switch having shunt field effect transistors, according to a first embodiment of the present invention.

FIG. 1 shows a circuit diagram of a high frequency switch circuit, that is, a two-input, four-output switch, according to the present invention. The two-input, four-output switch of the present invention differs from the prior art two-input, four-output switch shown in FIG. 7 by the inclusion of field effect transistors FET10 and FET9 which act as shunts for the signal terminals RF3 and RF4, respectively. More specifically, the field effect transistor FET10 is connected between the signal terminal RF3 and the ground GND which is the source of reference potential, and the field effect transistor FET9 is connected between the signal terminal RF4 and the ground GND, i.e., the source of reference potential.

Unlike the prior art configuration, the field effect transistors FET7, FET8, FET9, and FET10 are designed with characteristic impedances so as to match the characteristic impedances of first, second, third, and fourth external circuits (not shown) connected to the signal terminals RF6, RF1, RF4, and RF3, respectively.

The field effect transistors FET1 to FET6 each act as a switch for connecting or disconnecting the path between its associated two signal terminals, RF2 and RF1, RF2 and RF3, RF2 and RF4, RF5 and RF4, RF5 and RF6, or RF2 and RF6, respectively; on the other hand, the field effect transistors FET7 to FET10 each act as a switch for selecting whether its associated signal terminal RF6, RF1, RF4, or RF3, respectively, is to be connected to the reference potential, i.e., the ground, or to be left open, and as described above, each of these field effect transistors, when ON, provides a characteristic impedance that matches its associated external circuit.

Otherwise, the circuit configuration is the same as the prior art configuration shown in FIG. 7.

Figure 3:
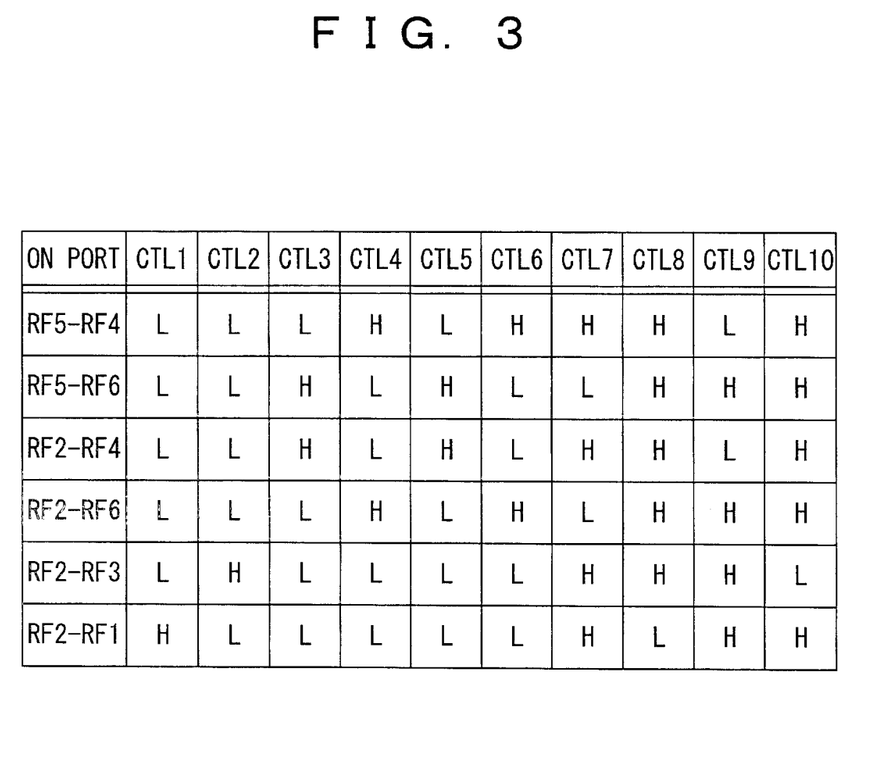
FIG. 3 is a truth table for explaining the operation of the two-input, four-output switches of FIGS. 1 and 2.

Here, by applying the control bias voltages CTL1 to CTL10 shown in FIG. 3 in accordance with the operating state of the two-input, four-output switch, a radio frequency signal can be carried from a selected one of the antennas to the receiver section or from the transmitter section to a selected one of the antennas.

In the two-input, four-output switch shown here, the signal terminals RF2 and RF5 are the input terminals, and the signal terminals RF1, RF3, RF4, and RF6 are the output terminals.

A description will be given of how the connection between the signal terminal RF1 and the signal terminal RF2 is turned on in the two-input, four-output switch. In this case, the control bias voltages CTL1 to CTL10 are set to the voltage levels shown in the ON PORT "RF2-RF1" row in FIG. 3. As a result, the field effect transistors FET1, FET7, FET9, and FET10 are ON, and the field effect transistors FET2 to FET6 and FET8 are OFF. This puts the signal path between the signal terminal RF1 and the signal terminal RF2 in a low loss state, and the signal path between the signal terminal RF1 and the signal terminal RF2 is thus put in a state that can carry a radio frequency signal therethrough.

In this case, the signal terminals RF3, RF4, and RF6 are grounded. This provides increased isolation. Since the signal terminals RF5 and RF2 are isolated from each other by two series field effect transistors, sufficient isolation can be obtained even when the signal terminal RF5 is not particularly grounded.

At this time, in the prior art two-input, four-output switch, since the path states of the signal terminals RF3 and RF4 are undetermined, the signal terminals RF3 and RF4 become open ends while on board the system. Therefore, resonance occurs due to the bonding wire and leads connected to these open ended signal terminals RF3 and RF4 and the wiring lines and devices formed on the printed circuit board and connected to the leads. In the prior art, this resonance has lead to the production of standing waves on the paths passing through the signal terminals RF3 and RF4.

By contrast, in the two-input, four-output switch of the first embodiment of the invention, by causing the field effect transistors FET9 and FET10 to conduct, that is, by turning on these transistors, the paths passing through the signal terminals RF3 and RF4 can be grounded with the characteristic impedances matched to the characteristic impedances of their associated external circuits. This prevents these paths from being affected by standing waves when mounted on the circuit board.

The reason is as follows. That is, resonance occurs due to the bonding wire and leads connected to the open ended signal terminals RF3 and RF4 and the wiring lines and devices formed on the printed circuit board and connected to the leads; however, when the open ended terminals are grounded via the shunt field effect transistors FET9 and FET10 while maintaining the impedance matching to the external circuits, it becomes possible to prevent the resonance from affecting the signal path connected via the field effect transistors FET2 and FET3 to the open ended terminals.

In the first embodiment, the field effect transistors FET7, FET8, FET9, and FET10 each have a gate width of about 50 μm and an ON-state characteristic impedance of about 50 ohms so as to match the characteristic impedance of the respective external circuits.

In the first embodiment, the voltage standing wave ratio is 1.5.

Standing waves will be explained here. The production of a standing wave depends on what is connected to a signal terminal, that is, an external circuit connected to it. Accordingly, whether the production of a standing wave can be suppressed or not differs from circuit to circuit. However, according to the embodiment of the invention, it becomes possible to prevent the produced standing wave from affecting the signal path.

The voltage standing wave ratio can be obtained from the following equation, by measuring reflected power for input power.

Voltage standing wave ratio=(Input power+Reflected power)/(Input power−Reflected power)

It is desirable that the above value be as close to 1 as possible, and if the value is 2.0 or smaller, there will be no problem for practical use. The value of 1.5 is well within the practical range.

Next, a description will be given of how the connection between the signal terminal RF3 and the signal terminal RF2 is turned on. In this case, the control bias voltages CTL1 to CTL10 are set to the voltage levels shown in the ON PORT "RF2-RF3" row in FIG. 3. As a result, the field effect transistors FET2, FET7, FET8, and FET9 are ON, and the field effect transistors FET1, FET3 to FET6, and FET10 are OFF. This puts the signal path between the signal terminal RF3 and the signal terminal RF2 in a low loss state, and the signal path between the signal terminal RF3 and the signal terminal RF2 is thus put in a state that can carry a radio frequency signal therethrough.

In this case, the signal terminals RF1, RF4, and RF6 are grounded. This provides increased isolation. Since the signal terminals RF5 and RF2 are isolated from each other by two series field effect transistors, sufficient isolation can be obtained even when the signal terminal RF5 is not particularly grounded.

Next, a description will be given of how the connection between the signal terminal RF6 and the signal terminal RF2 is turned on. In this case, the control bias voltages CTL1 to CTL10 are set to the voltage levels shown in the ON PORT "RF2-RF6" row in FIG. 3. As a result, the field effect transistors FET4, FET6, and FET8 to FET10 are ON, and the field effect transistors FET1 to FET3, FET5, and FET7 are OFF. This puts the signal path between the signal terminal RF6 and the signal terminal RF2 in a low loss state, and the signal path between the signal terminal RF6 and the signal terminal RF2 is thus put in a state that can carry a radio frequency signal therethrough.

In this case, the signal terminals RF1, RF3, and RF4 are grounded. The signal terminal RF5 is also grounded because the field effect transistor FET4 is ON. This provides increased isolation.

Next, a description will be given of how the connection between the signal terminal RF4 and the signal terminal RF2 is turned on. In this case, the control bias voltages CTL1 to CTL10 are set to the voltage levels shown in the ON PORT "RF2-RF4" row in FIG. 3. As a result, the field effect transistors FET3, FET5, FET7, FET8, and FET10 are ON, and the field effect transistors FET1, FET2, FET4, FET6, and FET9 are OFF. This puts the signal path between the signal terminal RF4 and the signal terminal RF2 in a low loss state, and the signal path between the signal terminal RF4 and the signal terminal RF2 is thus put in a state that can carry a radio frequency signal therethrough.

In this case, the signal terminals RF1, RF3, and RF6 are grounded. The signal terminal RF5 is also grounded because the field effect transistor FET5 is ON. This provides increased isolation.

Next, a description will be given of how the connection between the signal terminal RF5 and the signal terminal RF6 is turned on. In this case, the control bias voltages CTL1 to CTL10 are set to the voltage levels shown in the ON PORT "RF5-RF6" row in FIG. 3. As a result, the field effect transistors FET3, FET5, FET8 to FET10 are ON, and the field effect transistors FET1, FET2, FET4, FET6, and FET7 are OFF. This puts the signal path between the signal terminal RF5 and the signal terminal RF6 in a low loss state, and the signal path between the signal terminal RF5 and the signal terminal RF6 is thus put in a state that can carry a radio frequency signal therethrough.

In this case, the signal terminals RF1, RF3, and RF4 are grounded. The signal terminal RF2 is also grounded because the field effect transistor FET3 is ON. This provides increased isolation.

Next, a description will be given of how the connection between the signal terminal RF5 and the signal terminal RF4 is turned on. In this case, the control bias voltages CTL1 to CTL10 are set to the voltage levels shown in the ON PORT "RF5-RF4" row in FIG. 3. As a result, the field effect transistors FET4, FET6 to FET8, and FET10 are ON, and the field effect transistors FET1 to FET3, FET5, and FET9 are OFF. This puts the signal path between the signal terminal RF5 and the signal terminal RF4 in a low loss state, and the signal path between the signal terminal RF5 and the signal terminal RF4 is thus put in a state that can carry a radio frequency signal therethrough.

In this case, the signal terminals RF1, RF3, and RF6 are grounded. The signal terminal RF2 is also grounded because the field effect transistor FET6 is grounded. This provides increased isolation.

Figure 4:
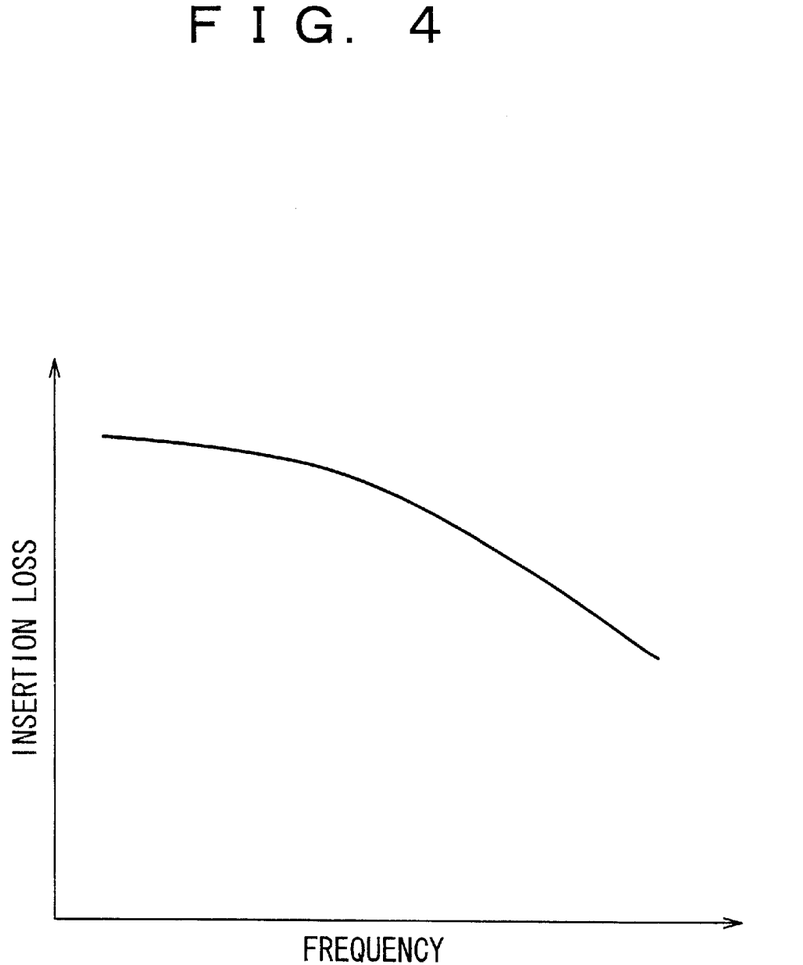
FIG. 4 is a characteristic diagram showing the insertion loss characteristics of the two-input, four-output switches of FIGS. 1 and 2.

FIG. 4 shows the measured results of the insertion loss in the first embodiment. The frequency is plotted along the abscissa and the insertion loss along the ordinate. As can be seen from FIG. 4, according to the first embodiment, there occur no abrupt increases in insertion loss at any specific frequencies.

With this configuration, the effects of the standing waves produced on the paths that are open ends when mounted on the system circuit board can be prevented from reaching the signal path used for signal transmission/reception, and the in-band ripple in the insertion loss occurring in specific paths can be eliminated.

Embodiment 2

Figure 2:
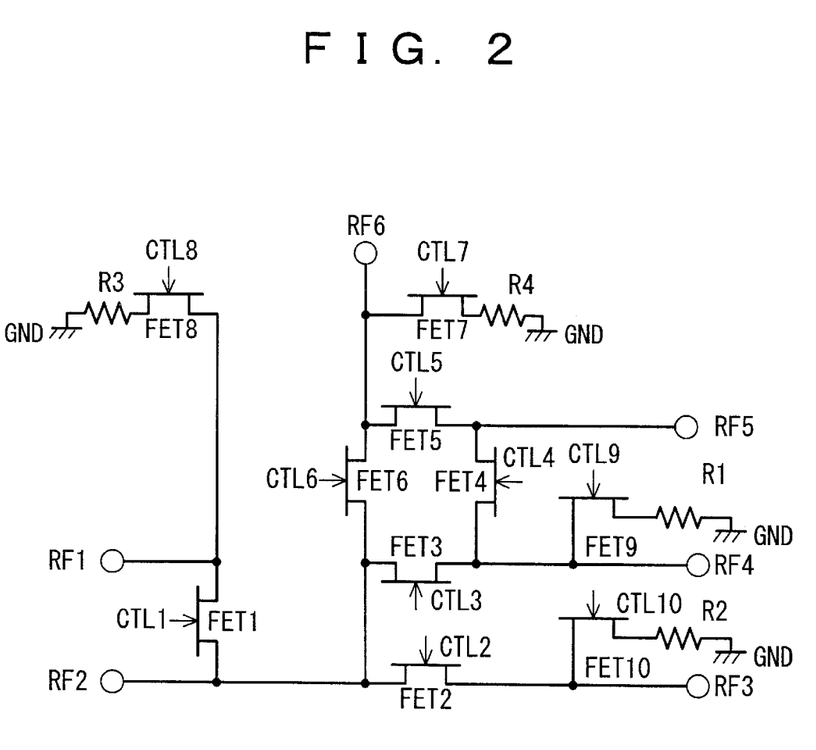
FIG. 2 is a circuit diagram showing the detailed configuration of a two-input, four-output switch having shunt field effect transistors, according to a second embodiment of the present invention.

FIG. 2 shows a two-input, four-output switch according to the present invention. The second embodiment shown here differs from the first embodiment in that resistors R1, R2, R3, and R4 are inserted between the ground GND and the ground GND side terminals of the field effect transistors FET9, FET10, FET8, and FET7, respectively. These resistors R1, R2, R3, and R4 are formed on a semiconductor substrate by ion implantation, together with the respective field effect transistors FET9, FET10, FET8, and FET7. That is, this embodiment is characterized by the use of series circuits each consisting of a field effect transistor and a resistor, instead of using each field effect transistor FET alone. The connection order of the field effect transistor and the resistor is not limited to the one shown in the figure, but may be reversed.

In this configuration also, resonance occurs due to the bonding wire and leads connected to the open ended signal terminals and the wiring lines and devices formed on the printed circuit board and connected to the leads. However, with the configuration of the second embodiment, since the combined impedance of the shunt field effect transistor connected to each open ended terminal and the resistor connected to it can be matched to the impedance of its associated external circuit, it becomes possible to prevent the effects of the resonance from reaching the signal path connected to the open ended terminal via a field effect transistor.

In the second embodiment, the field effect transistors FET9, FET10, FET7, and FET8 are each designed to have an ON-state characteristic impedance which, when combined with the resistance value of the resistor R1, R2, R3, or R4 connected to it, provides a resistance value of 50 Ohms that matches the external impedance. In the second embodiment, the voltage standing wave ratio is 1.6.

The measured results of the insertion loss in the second embodiment are the same as those shown in FIG. 4.

By employing the second embodiment, the size of each field effect transistor can be reduced compared with that in the first embodiment. This offers the advantage of being able to reduce the chip size.

With this configuration, the effects of the standing waves produced on the paths that are open ends when mounted on the system circuit board can be prevented from reaching the signal path used for signal transmission/reception, and the in-band ripple in the insertion loss occurring in specific paths can be eliminated.

Each of the above embodiments has been described for the case in which the field effect transistors FET1 to FET10 are controlled by applying the control bias voltages CTL1 to CTL10, respectively. Here, the control bias voltages to be applied to the control terminals of the field effect transistors FET1 to FET10 can be generated using a logic circuit.

To control the ON/OFF operations of the field effect transistors FET1 to FET10, normally 10 input terminals are needed in order to apply the control bias voltages to the 10 field effect transistors FET1 to FET10. By contrast, in the case of the circuit configuration of the present invention, since one of the six paths is selected, if a logic circuit is constructed that implements a truth table with six inputs and ten outputs as shown in FIG. 3, the number of input terminals can be reduced to 6, and thus, the number of control signal lines can be reduced. Furthermore, since the selection of one path from the six paths can be accomplished by combining the states of three signal lines, the number of input terminals can be reduced to 3, thus making it possible to further reduce the number of control signal lines.

In each of the above embodiments, each switch has been shown as being constructed from a single field effect transistor, but instead, the switch may be constructed using a series circuit of a plurality of field effect transistors.

Further, the above embodiments have each been described for the case where each field effect transistor is constructed as a single-gate field effect transistor, but the invention is not limited to this particular configuration, but can also be applied to the case where multi-gate field effect transistors are used as the field effect transistors.

What is claimed is:

1. A high frequency switch circuit comprising:

first, second, third, fourth, fifth, and sixth signal terminals;

a first field effect transistor circuit inserted in a first signal path connecting between the first signal terminal and the second signal terminal;

a second field effect transistor circuit inserted in a second signal path connecting between the second signal terminal and the third signal terminal;

a third field effect transistor circuit inserted in a third signal path connecting between the second signal terminal and the fourth signal terminal;

a fourth field effect transistor circuit inserted in a fourth signal path connecting between the fourth signal terminal and the fifth signal terminal;

a fifth field effect transistor circuit inserted in a fifth signal path connecting between the fifth signal terminal and the sixth signal terminal;

a sixth field effect transistor circuit inserted in a sixth signal path connecting between the second signal terminal and the sixth signal terminal;

a seventh field effect transistor circuit connected between the sixth signal terminal and a reference potential;

an eighth field effect transistor circuit connected between the first signal terminal and the reference potential;

a ninth field effect transistor circuit connected between the fourth signal terminal and the reference potential;

a tenth field effect transistor circuit connected between the third signal terminal and the reference potential;

first to tenth control lines for applying first to tenth control bias voltages to the control terminals of the first to tenth field effect transistor circuits; and a logic circuit for generating the control bias voltages to be applied to the first to tenth field effect transistor circuits, wherein each of the seventh, eighth, ninth, and tenth field effect transistor circuits, when ON, exhibits a characteristic impedance that satisfies a matching condition to the characteristic impedance of an associated one of first, second, third, and fourth external circuits connected to the sixth, first, fourth, and third signal terminals, respectively.

2. A high frequency switch circuit comprising:

first, second, third, fourth, fifth, and sixth signal terminals;

a first field effect transistor circuit inserted in a first signal path connecting between the first signal terminal and the second signal terminal;

a second field effect transistor circuit inserted in a second signal path connecting between the second signal terminal and the third signal terminal;

a third field effect transistor circuit inserted in a third signal path connecting between the second signal terminal and the fourth signal terminal;

a fourth field effect transistor circuit inserted in a fourth signal path connecting between the fourth signal terminal and the fifth signal terminal;

a fifth field effect transistor circuit inserted in a fifth signal path connecting between the fifth signal terminal and the sixth signal terminal;

a sixth field effect transistor circuit inserted in a sixth signal path connecting between the second signal terminal and the sixth signal terminal;

a series circuit consisting of a seventh field effect transistor circuit and a first resistor, and connected between the sixth signal terminal and a reference potential;

a series circuit consisting of an eighth field effect transistor circuit and a second resistor, and connected between the first signal terminal and the reference potential;

a series circuit consisting of a ninth field effect transistor circuit and a third resistor, and connected between the fourth signal terminal and the reference potential;

a series circuit consisting of a tenth field effect transistor circuit and a fourth resistor, and connected between the third signal terminal and the reference potential; and first to tenth control lines for applying first to tenth control bias voltages to the control terminals of the first to tenth field effect transistor circuits, wherein sum of an ON-state characteristic impedance of the seventh field effect transistor circuit and a resistance value of the first resistor satisfies a matching condition to the characteristic impedance of a first external circuit connected to the sixth signal terminal, sum of an ON-state characteristic impedance of the eighth field effect transistor circuit and a resistance value of the second resistor satisfies a matching condition to the characteristic impedance of a second external circuit connected to the first signal terminal, sum of an ON-state characteristic impedance of the ninth field effect transistor circuit and a resistance value of the third resistor satisfies a matching condition to the characteristic impedance of a third external circuit connected to the fourth signal terminal, and sum of an ON-state characteristic impedance of the tenth field effect transistor circuit and a resistance value of the fourth resistor satisfies a matching condition to the characteristic impedance of a fourth external circuit connected to the third signal terminal.

3. A high frequency switch circuit as set forth in claim 2, further comprising a logic circuit for generating the control bias voltages to be applied to the first to tenth field effect transistor circuits.

4. A high frequency switch circuit as set forth in claim 2, wherein the first to tenth field effect transistor circuits are each constructed from a single field effect transistor or a series circuit of a plurality of field effect transistors.

5. A high frequency switch circuit as set forth in claim 2, wherein field effect transistors forming the first to tenth field effect transistor circuits are single-gate field effect transistors or multi-gate field effect transistors.

6. A high frequency switch circuit as set forth in claim 2, wherein the first to tenth field effect transistor circuits and the first to fourth resistors are formed on a semiconductor substrate.

7. A communications terminal comprising:

a high frequency switch circuit having first, second, third, fourth, fifth, and sixth signal terminals;

first, second, third, and fourth antennas electrically connected to the first, third, fourth, and sixth signal terminals, respectively;

a receiver section which is connected to the second signal terminal, and to which high frequency signals received at the first, second, third, and fourth antennas are input; and a transmitter section which is connected to the fifth signal terminal, and which outputs high frequency signals to the third and fourth antennas, and wherein the high frequency switch circuit comprises:

a first field effect transistor circuit inserted in a first signal path connecting between the first signal terminal and the second signal terminal;

a second field effect transistor circuit inserted in a second signal path connecting between the second signal terminal and the third signal terminal;

a third field effect transistor circuit inserted in a third signal path connecting between the second signal terminal and the fourth signal terminal;

a fourth field effect transistor circuit inserted in a fourth signal path connecting between the fourth signal terminal and the fifth signal terminal;

a fifth field effect transistor circuit inserted in a fifth signal path connecting between the fifth signal terminal and the sixth signal terminal;

a sixth field effect transistor circuit inserted in a sixth signal path connecting between the second signal terminal and the sixth signal terminal;

a series circuit consisting of a seventh field effect transistor circuit and a first resistor, and connected between the sixth signal terminal and a reference potential;

a series circuit consisting of an eighth field effect transistor circuit and a second resistor, and connected between the first signal terminal and the reference potential;

a series circuit consisting of a ninth field effect transistor circuit and a third resistor, and connected between the fourth signal terminal and the reference potential;

a series circuit consisting of a tenth field effect transistor circuit and a fourth resistor, and connected between the third signal terminal and the reference potential; and first to tenth control lines for applying first to tenth control bias voltages to the control terminals of the first to tenth field effect transistor circuits, wherein sum of an ON-state characteristic impedance of the seventh field effect transistor circuit and a resistance value of the first resistor satisfies a matching condition to the characteristic impedance of a first external circuit connected to the sixth signal terminal, sum of an ON-state characteristic impedance of the eighth field effect transistor circuit and a resistance value of the second resistor satisfies a matching condition to the characteristic impedance of a second external circuit connected to the first signal terminal, sum of an ON-state characteristic impedance of the ninth field effect transistor circuit and a resistance value of the third resistor satisfies a matching condition to the characteristic impedance of a third external circuit connected to the fourth signal terminal, and sum of an ON-state characteristic impedance of the tenth field effect transistor circuit and a resistance value of the fourth resistor satisfies a matching condition to the characteristic impedance of a fourth external circuit connected to the third signal terminal.

* * * * *